(12) United States Patent
Coccioli et al.

(10) Patent No.: US 6,863,548 B1
(45) Date of Patent: Mar. 8, 2005

(54) METHOD AND APPARATUS FOR IMPROVING THE PERFORMANCE OF EDGE LAUNCH ADAPTERS

(75) Inventors: Roberto Coccioli, Simi Valley, CA (US); Keith Schmidt, Moorpark, CA (US)

(73) Assignee: INPHI Corporation, Westlake Village, CA (US)

( * ) Notice: Subject to any disclaimer, the term of this patent is extended or adjusted under 35 U.S.C. 154(b) by 0 days.

(21) Appl. No.: 10/454,844

(22) Filed: Jun. 4, 2003

(51) Int. Cl.[7] .................................. H01R 4/66
(52) U.S. Cl. ........................................ 439/101
(58) Field of Search ...................... 439/101, 61, 63, 439/637, 581, 328

(56) References Cited

U.S. PATENT DOCUMENTS

| | | | |
|---|---|---|---|
| 3,871,728 A | * | 3/1975 | Goodman ................ 439/62 |
| 4,697,858 A | * | 10/1987 | Balakrishnan ............. 439/61 |
| 5,154,625 A | * | 10/1992 | Borokowski et al. ....... 439/161 |
| 5,853,303 A | * | 12/1998 | Brunker et al. ........... 439/637 |
| 6,468,089 B1 | * | 10/2002 | Hubbard et al. ........... 439/63 |
| 6,762,942 B1 | * | 7/2004 | Smith .................... 361/749 |

OTHER PUBLICATIONS

Wideband End Launch Assemblies Mount on Edge of Circuit Boards; Southwest Microwave, Inc., www.southwest-microwave.com.
Backside Connections; Bill Oldfield; Wiltron Co, Morgan Hill, CA Microwave Journal, 10/01.

* cited by examiner

Primary Examiner—J. F. Duverne
(74) Attorney, Agent, or Firm—Fernandez & Associates LLP

(57) ABSTRACT

A method and apparatus for improving the performance of an edge launch electrical connector. Two or more edge vias are established along an edge face of a planar circuit module, such as a single- or multi-layer PCB, integrated circuit on a ceramic or organic substrate or a ceramic or organic package, thereby providing a short path from one or more of the substrate assembly's ground planes to a ground associated with the edge launch electrical connector, reducing jitter and providing a solution with low insertion and return losses. The two edge vias may be standard vias, castellations or wires or lines deposited, printed, painted, secured or put in contact with an edge face of the planar circuit module and are arranged at each side of the signal line thereby providing additional electromagnetic shielding. Optionally, an air line may be established to increase the operational cut-off frequency and/or improve electrical performance.

58 Claims, 9 Drawing Sheets

A planar circuit module is prepared for coupling to an edge launch electrical connector assembly (S1).

One or more signal lines disposed in the plane of the planar circuit module extend substantially to the edge of the module (S2).

Two or more edge vias are established along an edge face of the planar circuit module (S3).

The planar circuit module is prepared so that when it is coupled to the edge launch electrical connector assembly, the edge vias may establish electrical contact between one or more ground planes of the planar circuit module and one or more grounds associated with the edge launch electrical connector assembly (S4).

Optionally, one or more air lines may be established (S5).

Figure 9

METHOD AND APPARATUS FOR IMPROVING THE PERFORMANCE OF EDGE LAUNCH ADAPTERS

BACKGROUND INFORMATION

1. Field of the Invention

The current invention relates to the field of adapters and more particularly to the field of edge launch adapters.

2. Description of Related Art

For high-frequency applications, establishing a connection between a signal line on a substrate, such as a printed circuit board (PCB), and a cable such as a coaxial cable can be expensive and problematic.

In some cases, edge launch adapters, also known as edge adapters or edge launchers, may be attached to the edge of a PCB and transition the signal to a coaxial cable. This type of configuration is popular for use with high frequency applications. A typical edge launch configuration may use a launcher, also called a coaxial cable connector, for coupling to a coaxial cable, a PCB and a bracket to provide support for coupling the launcher to the PCB. In many cases, a small central pin embedded in a glass bead may be housed in the bracket and used to establish the connection between the signal line on the PCB and the center conductor of the launcher. Typically, a designer will select a central pin diameter corresponding to the desired operating frequency; small diameter central pins may be used for high frequency applications whereas larger diameter central pins may be used for lower frequency applications. Typically, the cost of the glass bead as well as the cost of the launcher relates to the diameter size of the central pin. Usually, small diameter central pins require the use of high precision, expensive launchers such as Anritsu's K-type or V-type cable connectors (2.92 mm and 1.85 mm connectors, respectively) instead of less expensive launchers such as SubMiniature Version A (SMA) type cable connectors. Furthermore, depending on the board design, insertion losses and return losses can become problematic. Insertion losses and return losses are especially problematic for multi-layer PCBs with multiple metal layers. Long ground paths coupled to vias near the edge of the PCB can introduce unwanted input and output return loss and jitter.

Accordingly, it is desirable to have an inexpensive and robust method for establishing a connection between a planar signal line on a substrate and a cable capable of supporting operation over a wide frequency range. Ideally, the solution should work with any type of planar circuit module using any type of substrate, such as ceramic and organic substrates, and any type of PCB, such as a single or multi-layer PCB and provide a smooth transition from the planar circuit to the coaxial cable with low insertion losses and low return losses. Preferably, the solution may be implemented using currently available technologies and incorporated into currently available processes.

SUMMARY OF THE INVENTION

It is an object of the current invention to provide a method and apparatus for improving performance of an edge launch electrical connector. According to the current invention, this is achieved by establishing two or more edge vias along an edge face of the substrate, substrate assembly, or planar circuit module such as a PCB, for providing a short path from one or more of the substrate assembly's ground planes to a ground associated with the edge launch electrical connector. This short ground return path may reduce jitter and provide a solution with low insertion losses and low return losses. Preferably, two vias are arranged symmetrically about the signal line thereby providing additional electromagnetic shielding. Preferably, the edge vias are in very close proximity to the signal line in order to maximize their shielding effect and provide a short ground return path. However, according to alternate embodiments of the current invention, more than two vias may be present. Furthermore, the vias may or may not be arranged symmetrically about the signal line and may or may not be established in very close proximity to the signal line.

According to various embodiments of the current invention, edge vias may be: cropped cylindrical vias filled with a conducting material, cropped cylindrical vias partially filled with a conducting material thereby creating a via with a cropped toroidal shape, and/or castellations. Alternate embodiments of the current invention are envisioned such as edge vias constructed of conducting lines and/or wires deposited, printed, painted, secured or put in contact with an edge face of the planar circuit module for providing a short path from one or more of the substrate assembly's ground planes to a ground associated with the edge launch electrical connector.

Preferably, the current invention may provide low insertion losses and low return losses, even when used at high frequencies with planar circuit modules such as, but not limited to, ceramic packages or substrates and single- or multi-layer PCBs.

Optionally, according to the current invention, one or more cavities may be established to increase the operational cut-off frequency. Preferably, a cavity contains a gas, such as air, thereby creating an air line. Preferably, a cavity may be established between the edge launch connector contact to the signal line and the ground associated with the edge launch electrical connector ground. Preferably, the edge launch connector contact to the signal line is a central pin embedded in a dielectric material bead such as, but not limited to, a glass bead or a Teflon bead. Preferably, the cavity is established between the central pin and a bracket, used for coupling the launcher with the substrate or substrate assembly and providing the edge launch electrical connector ground. Optionally, the cavity may contain gases other than air, such as, but not limited to, nitrogen. Alternately, the cavity may be filled with other materials such as, but not limited to, dielectric materials such as Teflon.

Advantageously, the current invention may be designed and built using currently available technology.

BRIEF DESCRIPTION OF THE DRAWINGS

FIG. 9 illustrates a preferred process for improving the performance of an edge launch electrical connector assembly according to the current invention.

The figures referred to herein are drawn for clarity of illustration and are not necessarily drawn to scale.

DETAILED DESCRIPTION OF PREFERRED EMBODIMENTS

Figure 1:
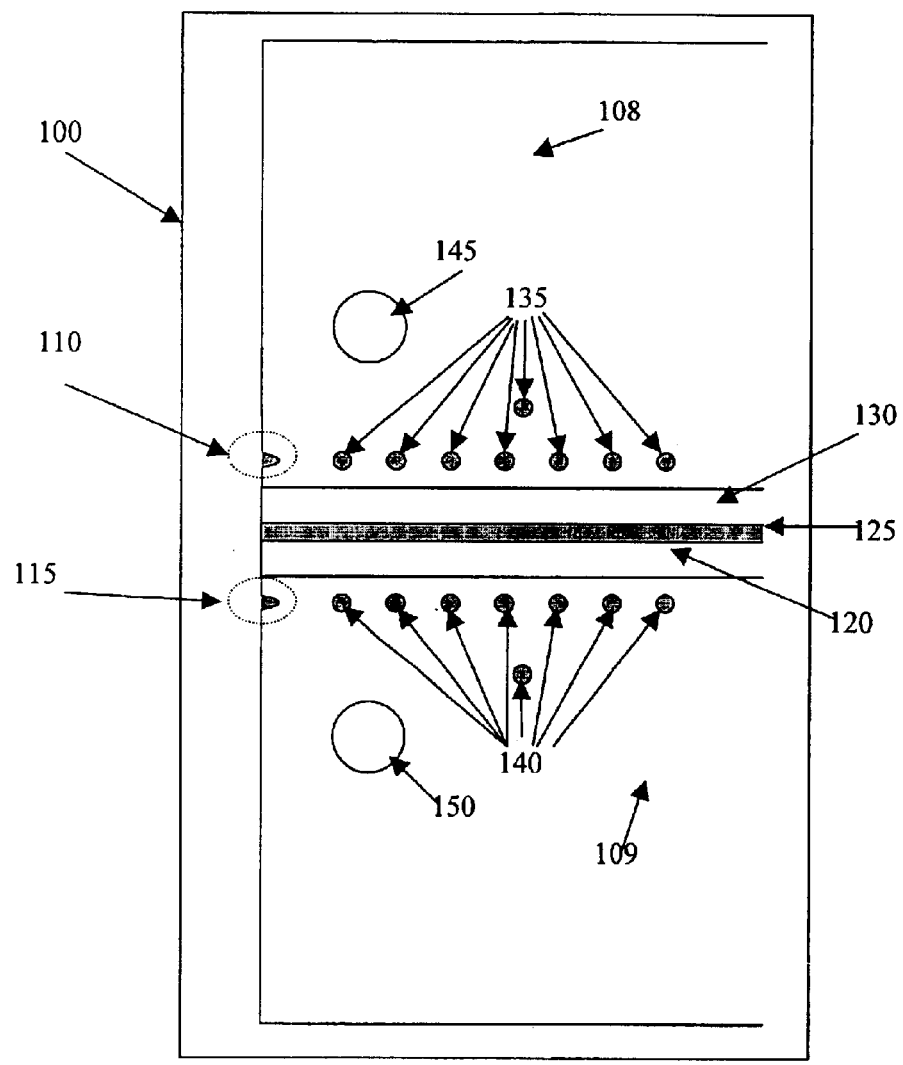
FIG. 1 illustrates a planar circuit module according to the current invention.
Figure 2:
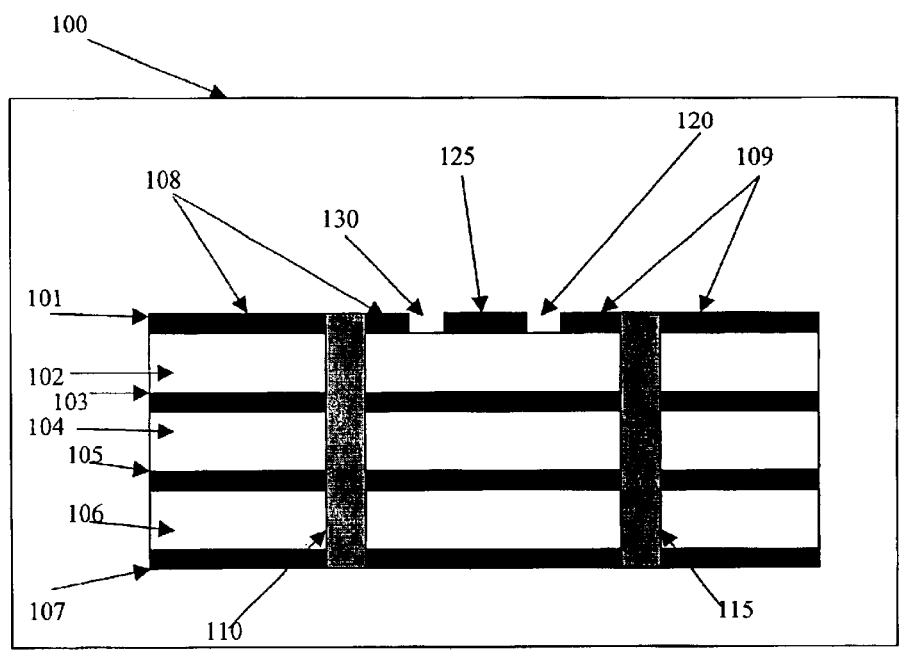
FIG. 2 illustrates a side view of a planar circuit module.
Figure 3:
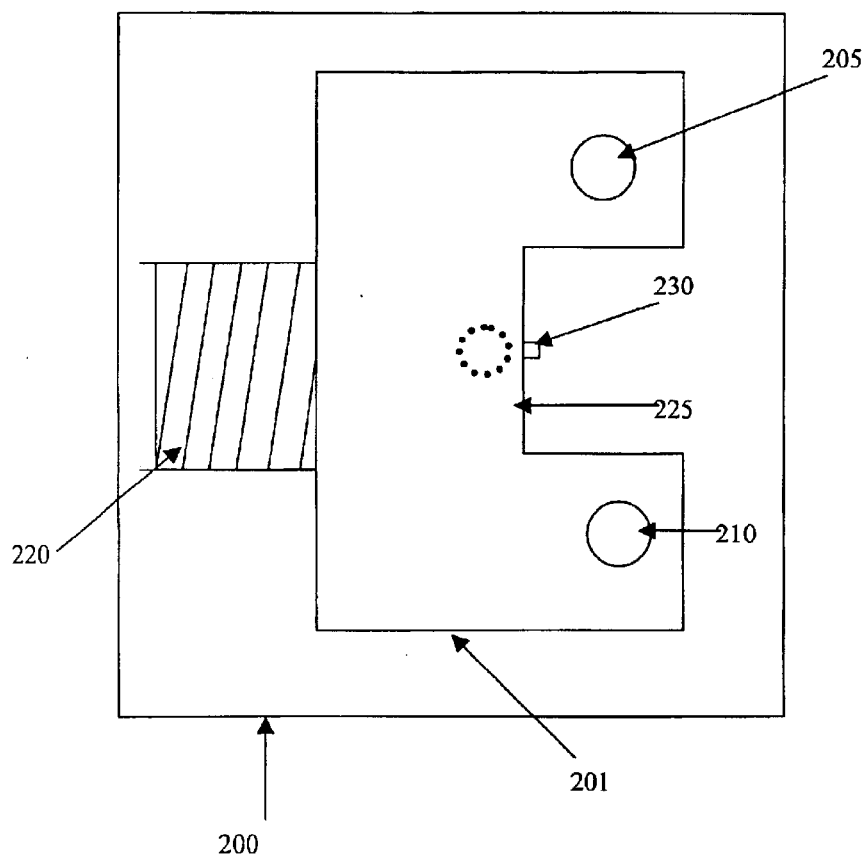
FIG. 3 illustrates an edge launch electrical connector according to a preferred embodiment of the current invention.
Figure 4:
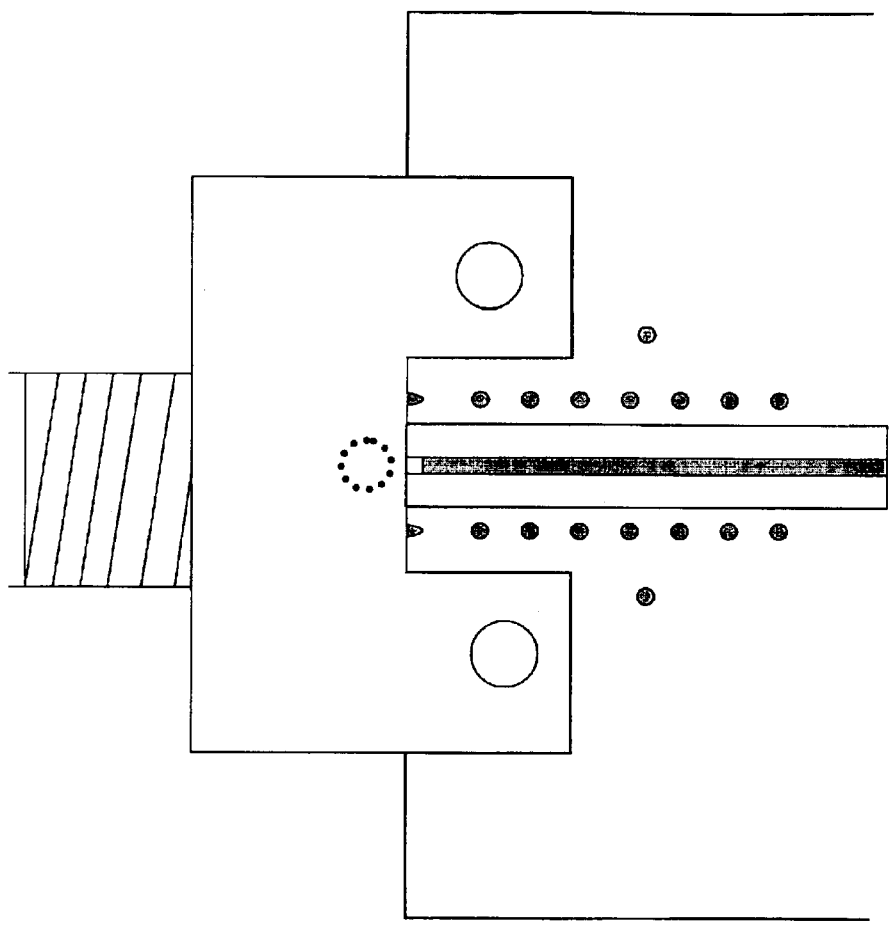
FIG. 4 illustrates a top view of a planar circuit module coupled to an edge launch electrical connector, according to a preferred embodiment of the current invention.

FIG. 1 illustrates a portion of planar circuit module 100 according to the current invention. In this example, a top view is shown of a ground backed coplanar waveguide (GB-CPW) 100 with a signal line 125 isolated by two adjacent insulating regions 120 and 130. FIG. 2 illustrates a side view of planar circuit module 100. Preferably, edge vias 110 and 115 provide contact between the top ground plane 101 of the GB-CPW, metal layer 103, metal layer 105 and the bottom ground plane 107 of the GB-CPW. FIG. 3 illustrates an edge launch electrical connector assembly 200 according to a preferred embodiment of the current invention. FIG. 4 illustrates a top view of planar circuit module 100 coupled to edge launch electrical connector assembly 200, according to a preferred embodiment of the current invention. When planar circuit module 100 is coupled to edge launch electrical connector assembly 200 as illustrated in FIG. 4, edge vias 110 and 115 may provide a short path for the ground return current from ground planes 101 and 107 as well as metal layers 103 and 105 on the planar circuit to the ground of the edge adapter assembly. In this example, bracket 201 provides the ground of the edge adapter assembly. In some cases, vias 110 and 115 may provide signal shielding to prevent signal leakage along the edges of board 100. Furthermore, the use of the edge vias to provide a ground return path does not preclude the use of other grounding mechanisms. According to a preferred embodiment of the current invention, edge vias may be used to reduce insertion losses, return losses and jitter. According to the current invention, these benefits enable the effective use of low cost edge launchers as part of the edge launch electrical connector assembly. For example, the typical manufacturer recommended maximum operating frequency for Wideband SubMiniature Version A type connectors (WSMA) is 34 GHz. However, a WSMA launcher may be incorporated into an edge launch electrical connector assembly according to a preferred embodiment of the current invention and used for operation at frequencies in excess of 34 GHz.

Planar Circuit Module

The example planar circuit module illustrated in FIGS. 1, 2 and 4 is a multi layer-PCB. However, according to the current invention, the planar circuit module may have any type substrate, such as, but not limited to, a ceramic substrate. For example, the planar circuit module may be a ceramic package. According to the current invention, the planar circuit module comprises one or more ground planes and one or more signal lines extending to the edge of the planar circuit module. In some cases, more than one ground plane and/or metal layer may be present in the planar circuit module.

In FIG. 1, optional holes 145 and 150 are drilled through the entire thickness of planar circuit module 100 to accommodate bolts that are used to couple bracket 201 to planar circuit module 100; optional holes 145 and 150 are meant to coincide with optional holes 205 and 210 in bracket 201. According to alternate embodiments of the current invention, additional and/or alternate methods may be used to provide stability and/or mechanical strength when coupling the planar circuit module to the edge launch electrical connector assembly.

In FIG. 1, regions 108 and 109 are coated with a conducting material providing an optional top ground plane. Optional vias 135 and 140 connect ground conductors 108 and 109 on each side of the signal line 125 with metal layers 103 and 105 and ground plane 107 below. However, according to alternate embodiments of the current invention, a top ground plane is not required. Optionally, one or more ground lines or ground pads may be available on the top layer. In this case, the optional vias may be configured to establish contact between one or more buried ground planes and the top plane. In some cases, where the planar circuit module supports multiple ground planes and/or multiple metal layers, the optional vias may or may not extend through the entire thickness of the planar circuit module. For example, in some cases, one or more of the optional vias may establish contact between the top plane and one or more, but not necessarily all, of the ground planes and/or metal layers. In FIG. 1, the optional vias 135 and 140 are arranged symmetrically about the signal line 125. This is the preferred, but not required, arrangement of optional vias. Optionally, one or more ground lines may be established parallel to the signal line. Preferably, ground lines running parallel and adjacent to the signal line surround a signal line symmetrically.

In FIG. 1, signal line 125 is illustrated as a substantially straight line of uniform line width. However, according to the current invention, the signal line may not be straight and/or may have varying line width. For example, in many cases, it may be preferable to taper or increase the line width of the signal line as it approaches the edge of the planar circuit module to provide a smooth transition for the electrical signal to the electrical contact on the edge launch electrical connector assembly. For example, it may be preferable to alter the line width of the signal line as it approaches the edge of the planar circuit module to closely approximate the width of a central pin.

Edge Launch Electrical Connector Assembly

Figure 5:
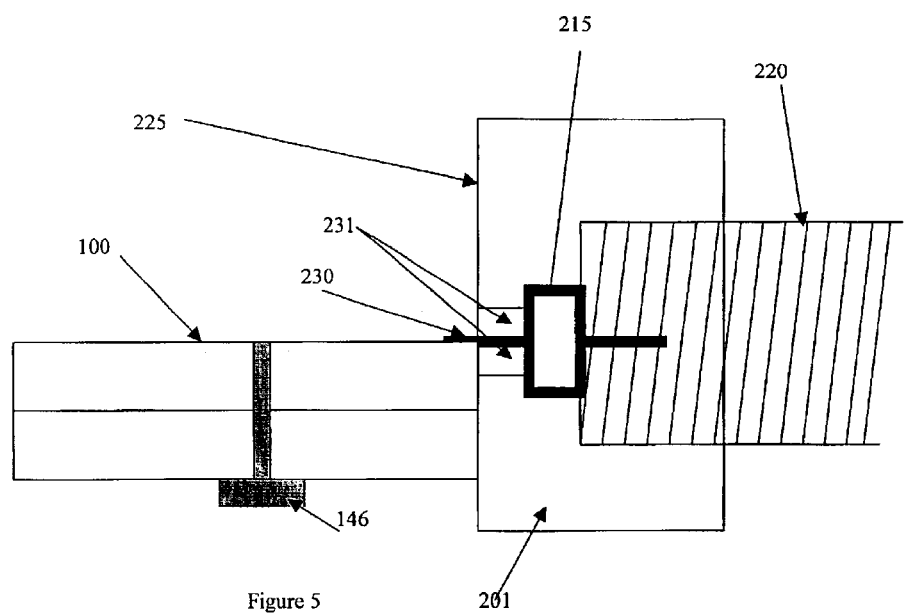
FIG. 5 is a cross sectional side view of a bracket mounted with a planar circuit module and coupled to a connector, according to a preferred embodiment of the current invention.
Figure 6:
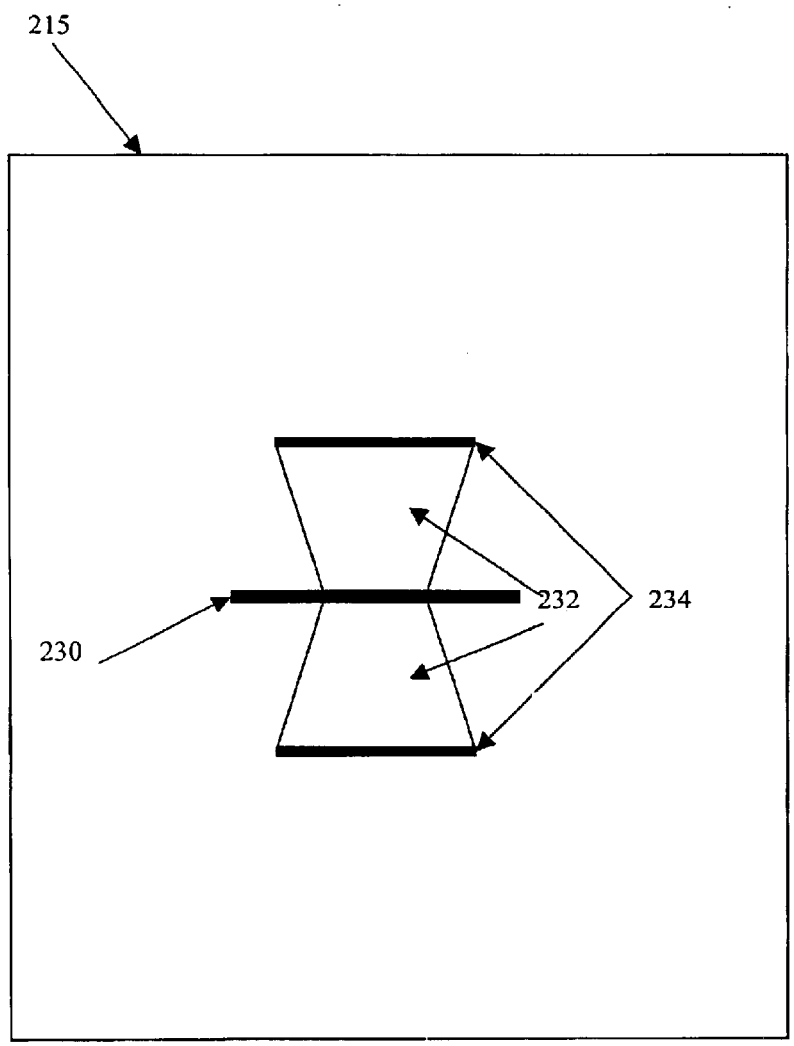
FIG. 6 illustrates a cross-sectional side view of an example of a glass bead with an embedded central pin.
Figure 7:
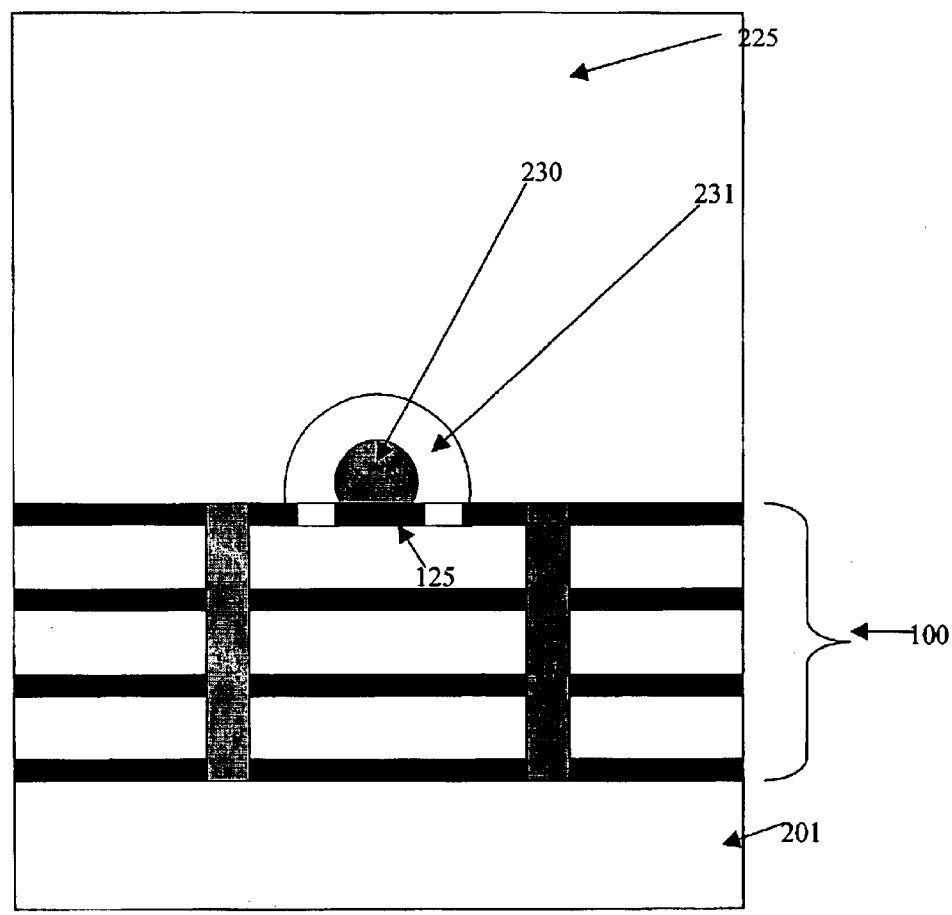
FIG. 7 is another view of a bracket, according to a preferred embodiment of the current invention.

Preferably, the edge launch electrical connector assembly comprises a launcher such as connector 220, illustrated in FIG. 3, for establishing a connection from the planar circuit module to the ground and signal conductors of a cable. According to the current invention, threaded launchers such as, but not limited to a coaxial connector, a 2.4 mm connector, a SubMiniature Version A (SMA) type connector, a Wideband SMA (WSMA) type connector, a 2.92 mm connector (such as an Anritsu K-type connector), and/or a 1.85 mm connector (such as an Anritsu K-type connector) may be used. Alternately, other types of launchers, such as, but not limited to, push-on launchers may be used. For example, according to the current invention, SMCC (SubMiniature Coaxial Connectors) launchers such as, but not limited to, the GPO™, GPPO™, SMP, SSMP™, and or Mini-SMP, may be used. Preferably, the edge launch electrical connector assembly further comprises one or more brackets such as bracket 201. Preferably, a bracket may be used to provide a ground conductor and a signal conductor. In this example, the metallic body of the bracket 201 acts as the ground conductor and provides the electrical connection from the edge vias 110 and 115 to the external conductor of launcher 220; launcher 220 may then establish the electrical connection between the bracket's ground conductor and the ground conductor of a cable. According to a preferred embodiment of the current invention, the bracket may house a signal conductor for providing the electrical connection between the planar transmission line on the board and the central signal conductor of the launcher; central signal conductor of the launcher establishes the electrical connection between the central signal conductor of the edge launch electrical connector assembly and the signal conductor of a cable such as the central signal conductor of a coaxial cable. In the case of bracket 201, the central pin 230 of a glass bead 215 provides the edge launch electrical connector assembly's signal conductor. FIG. 5 is a cross sectional side view of a bracket 201 mounted with a planar circuit module 100 and coupled to a launcher 220, according to a preferred embodiment of the current invention. Preferably, the edge launch electrical connector assembly's signal conductor is provided by a central pin embedded in a bead such as, but not limited to, a glass bead such as the Anritsu K-100. The Anritsu K-100 bead houses a 12 mil central pin. FIG. 6 illustrates a cross-sectional side view of an example of a glass bead 215 with an embedded central pin 230. Preferably, electrical contact between the central pin and the planar transmission line or signal line may be established by soldering. However, a variety of alternate technologies may be used to establish electrical contact between the central pin and the planar transmission line or signal line. In this example of a bead, material 232 is a dielectric or insulating material such as glass; the outside of the bead, indicated by 234, may be coated with a conductor such as gold-plated Kovar. The presence of the external conductor on the glass bead may improve the ability to attach the glass bead to the bracket by soldering. FIG. 7 is another view of a bracket 201 illustrating face 225 of a bracket 201 mounted with a planar circuit module 100, according to a preferred embodiment of the current invention. Preferably, the bracket holds the assembly in place and provides mechanical strength. Furthermore, the bracket may provide the ground conductor (the path to the ground associated with the edge launch electrical connector assembly). For example, according to a preferred embodiment of the current invention, the edge vias may establish contact with a conducting face 225 of the bracket, thereby establishing a short ground path. FIGS. 3, 4, 5 and 7 illustrate one example of a bracket 201. However, a variety of alternate geometries are envisioned wherein a design constraint is to establish electrical contact to some portion of two or more edge vias. According to an alternate embodiment of the current invention, only a portion of the bracket may comprise conducting material. According to alternate embodiments of the current invention, a bracket is not required. For example, the external conductor of a connector may be used to establish contact to the edge vias. In FIG. 7, central pin 230 is shown in contact with signal line 125. In this example, signal line 125 and central pin 230 are shown to be of similar dimension. However, according to alternate embodiments of the current invention, the signal line and the contact to the signal line are not necessarily of similar dimension.

Edge Vias

Figure 8:
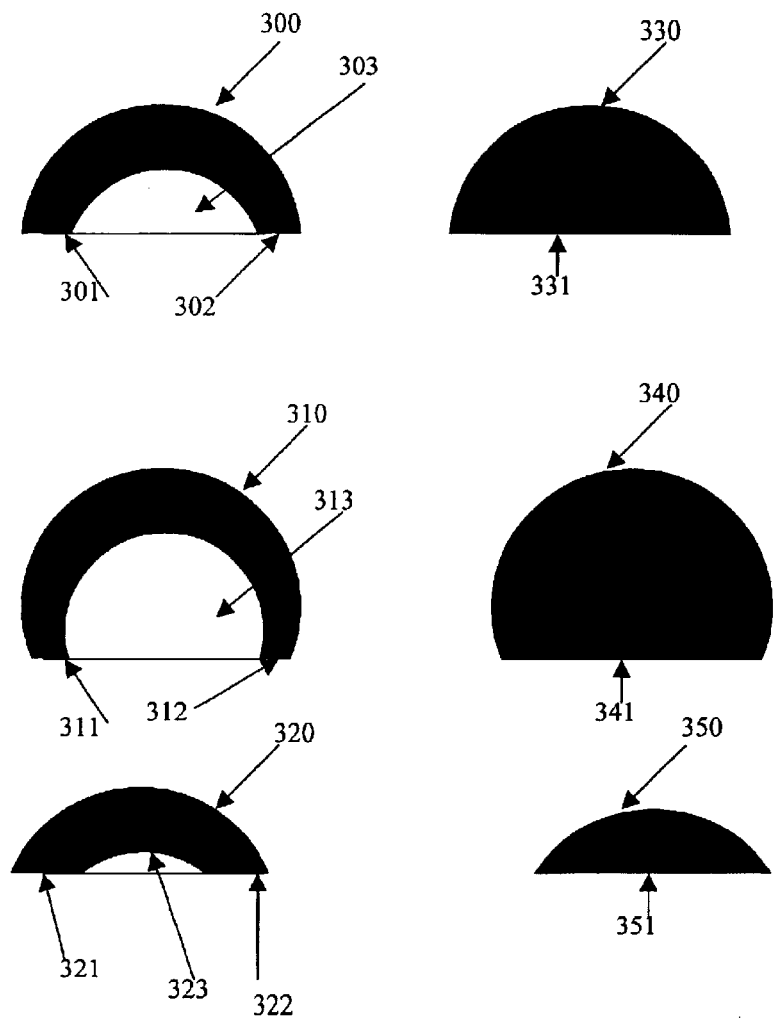
FIG. 8 illustrates examples of cross-sections for the edge vias, according to a preferred embodiment of the current invention.

FIG. 8 illustrates examples of cross-sections for the edge vias, according to a preferred embodiment of the current invention. The shape of the edge vias is likely to be related to the type of planar circuit module. For example, a typical PCB process may create typical vias that are the shape of a hollow cylinder that are coated with a conducting material. For this example, an edge via would look like a hollow cylinder that has been cropped to create a half toroid-like cross-sectional shape such as cross-sections 300, 310 and 320. Regions 303, 313 and 323 represent the "hollow" area left after the edge vias have been coated with a conducting material. Regions 301, 302, 311, 312, 321 and 322 represent conducting regions of the edge vias where electrical contact to the face of a bracket may be established, thereby creating a short ground path as described above. For planar circuit modules on a ceramic substrate or ceramic packages, cross sections of the edge vias may look more like 330, 340 and 350. For example, the edge vias for a ceramic substrate or ceramic package may be created by drilling a cylindrical hole, filling it with conducting material and then cropping the edge of the ceramic package thereby creating edge vias with solid semi-circular cross-sections. For this example, faces 331, 341 and 351 may provide regions of the edge vias where electrical contact to the face of a bracket may be established, thereby creating a short ground path as described above. According to various embodiments of the current invention, a variety of other edge via shapes may be implemented. For example, alternate embodiments of the current invention are envisioned comprising edge vias constructed of conducting lines and/or wires deposited, printed, painted, secured or put in contact with an edge face of the planar circuit module for providing a short path from one or more of the substrate assembly's ground planes to a ground associated with the edge launch electrical connector.

Air Line

Optionally, according to a preferred embodiment of the current invention, one or more cavities may be established. In some cases, this may increase the operational cut-off frequency of the edge launch electrical connector assembly, and/or improve electrical performance. Preferably, a cavity may be established between the edge launch connector contact to the signal line and the conductor associated with the edge launch electrical connector ground. For example, airline 231 illustrated in FIG. 5 is established between the central pin 230 and the conducting bracket 201 that serves as the edge launch electrical connector ground. Preferably, an airline, such as 231, may be established so that the diameter of the central pin 230 is surrounded by air for a portion of the length of the central pin 230 near the point where the central pin makes contact with the signal line on the planar circuit module, as illustrated in FIG. 5. Preferably the airline is roughly cylindrical in shape with a diameter greater than the dimensions of edge launch connector contact to the signal line, but not so large as to interfere with the contact of the edge via with the edge launch electrical connector ground. In this example, the shape of airline 231 is roughly cylindrical with a diameter less than the diameter of the glass bead 215 and greater than the diameter of central pin 230. However, alternate embodiments of the current invention may have airlines of different shapes. Optionally, the cavity may contain gases other than air, such as, but not limited to, nitrogen. Alternately, the cavity may be filled with other materials such as, but not limited to, dielectric materials such as Teflon.

Method

FIG. 9 illustrates a preferred process for improving the performance of an edge launch electrical connector assembly according to the current invention. Preferably, according to the current invention, the process for improving the performance of an edge launch electrical connector assembly begins when a planar circuit module is prepared for coupling to an edge launch electrical connector assembly (S1). Examples of a planar circuit module include, but are not limited to, a single-layer PCB, a multi-layer PCB, a circuit patterned on a ceramic substrate and a ceramic package. Preferably, the planar circuit module may have one or more ground planes. Preferably, the edge launch electrical connector assembly comprises one or more connectors and one or more optional brackets. Preferably, the bracket provides mechanical strength, stability and/or one or more grounds. Preferably, the bracket may also couple the signal line from the planar circuit module to the signal conductor of the launcher. For example, the bracket may house a central pin embedded in a dielectric material such as, but not limited to, glass or Teflon, and the central pin may be used to couple signal line from the planar circuit module to the signal conductor of the launcher. Preferably, the bracket may also couple one or more of the ground planes from the planar circuit module to the connector ground. One or more signal lines disposed in the plane of the planar circuit module extend substantially to the edge of the module (S2). The signal lines may vary in line width and may or may not be straight lines. Two or more edge vias are established along an edge face of the planar circuit module (S3). Preferably, the edge vias establish electrical contact between a ground line on the top of the planar circuit module with one or more ground planes in the circuit module. Preferably, the edge vias may be positioned adjacent to the signal line. Preferably, the edge vias may be disposed symmetrically about the signal line. In some cases, the edge vias may be half vias or castellations. The planar circuit module is prepared so that when it is coupled to the edge launch electrical connector assembly, the edge vias may establish electrical contact between one or more ground planes of the planar circuit module and one or more grounds associated with the edge launch electrical connector assembly (S4). The short ground return path that may be established in S4 may produce a connection with low jitter, insertion losses and return losses. Optionally, one or more air lines may be established (S5). Preferably, an air line comprises one or more cavities in the edge launch electrical connector assembly. Preferably, the cavity is established between a conductor in contact with the planar circuit module's signal line and one or more of said grounds associated with the edge launch electrical connector assembly. In some cases, the cavity may be filled with air, nitrogen, a non-corrosive gas and/or a dielectric material.

The foregoing described embodiments of the invention are provided as illustrations and descriptions. They are not intended to limit the invention to precise form described. In particular, the Applicants contemplate that functional implementation of the invention described herein may be implemented equivalently in other available functional components or building blocks. Also, the process steps describing the methods may be re-arranged and/or re-ordered. Other variations and embodiments are possible in light of above teachings, and it is thus intended that the scope of invention not be limited by this Detailed Description, but rather by claims following.

We claim:

1. A method for improving the performance of an edge launch electrical connector assembly comprising the steps of:
   one or more buried or exposed ground planes of said planar circuit module and
   one or more signal lines disposed in the plane of said planar circuit module and extending substantially to the edge of said planar circuit module for launching a signal out of said planar circuit module to said edge launch electrical connector assembly and
   establishing two or more edge vias disposed along an edge face of said planar circuit module for establishing an electrical connection between
   one or more buried or exposed ground planes of said planar circuit module and one or more ground conductors associated with said edge launch electrical connector assembly thereby providing a path to ground return current;
   wherein the edge vias provide the shortest possible path to the buried or exposed ground plane.

2. The method of claim 1 wherein said planar circuit module is selected from this list of:
   a planar circuit board comprising one or more metal layers;
   a package for integrated circuits comprising one or more metal layers;
   a circuit and one or more metal layers established on a substrate; and
   a circuit established on a substrate coupled with one or more metal layers.

3. The method of claim 1 wherein said edge launch electrical connector assembly comprises one or more electrical connectors or launchers.

4. The method of claim 3 wherein said edge launch electrical connector assembly further comprises one or more brackets.

5. The method of claim 4 wherein said bracket provides said one or more ground conductors associated with said edge launch electrical connector assembly thereby providing a path to ground return current.

6. The method of claim 4 wherein said bracket may house a signal conductor for carrying said signal out of said planar circuit module to said electrical connector.

7. The method of claim 6 wherein said signal conductor comprises a central pin embedded in a bead.

8. The method of claim 3 wherein said electrical connector is a coaxial connector or launcher.

9. The method of claim 1 wherein one or more of said edge vias comprise a via selected from the list of:
   a cropped cylindrical via filled with a conducting material;
   a cropped cylindrical via partially filled with a conducting material thereby creating a via with a cropped toroidal shape;
   a castellation.

10. The method of claim 1 wherein the step of establishing two or more edge vias comprises printing or depositing a line along said edge face of said planar circuit module establishing an electrical contact with one or more buried ground planes in the planar circuit module.

11. The method of claim 1 wherein the step of establishing two or more edge vias comprises positioning a wire along said edge face of said planar circuit module establishing an electrical contact with one or more buried ground planes in the planar circuit module.

12. The method of claim 1 further comprising the step of establishing one or more air lines.

13. The method of claim 12 wherein said air line comprises one or more cavities in said edge launch electrical connector assembly between a conductor in contact with one or more of said signal lines and one or more of said grounds associated with said edge launch electrical connector assembly.

14. The method of claim 12 wherein one or more of said air lines are filled with one or more gases selected from the list of:
   air;
   nitrogen; and,
   non-corrosive gas.

15. The method of claim 1 wherein two or more of said edge vias are disposed symmetrically around one of said signal lines.

16. The method of claim 1 wherein two of said edge vias are disposed very close to one of said signal lines.

17. A planar circuit module for establishing improved electrical connections to an edge launch electrical connector assembly comprising:

one or more buried or exposed ground planes and one or more signal lines disposed in the plane of said planar circuit module and extending substantially to the edge of said planar circuit module for launching a signal out of said planar circuit module to said edge launch electrical connector assembly and two or more edge vias disposed along an edge face of said planar circuit module for establishing an electrical connection between one or more buried or exposed ground planes of said planar circuit module and one or more ground conductors associated with said edge launch electrical connector assembly;

wherein the edge vias provide the shortest possible path to the buried or exposed ground plane.

18. The planar circuit module of claim 17 wherein said planar circuit module is selected from this list of:

a planar circuit board comprising one or more metal layers;

a package for integrated circuits comprising one or more metal layers;

a circuit and one or more metal layers established on a substrate; and a circuit established on a substrate coupled with one or more metal layers.

19. The planar circuit module of claim 17 wherein said edge launch electrical connector assembly comprises one or more electrical connectors or launchers.

20. The planar circuit module of claim 19 wherein said edge launch electrical connector assembly further comprises one or more brackets.

21. The planar circuit module of claim 20 wherein said bracket provides said one or more ground conductors associated with said edge launch electrical connector assembly.

22. The planar circuit module of claim 20 wherein said bracket may house a signal conductor for carrying said signal out of said planar circuit module to said electrical connector or launcher.

23. The planar circuit module of claim 22 wherein said signal conductor comprises a central pin embedded in a bead.

24. The planar circuit module of claim 19 wherein said electrical connector is a coaxial connector or launcher.

25. The planar circuit module of claim 17 wherein one or more of said edge vias comprise a via selected from the list of:

a cropped cylindrical via filled with a conducting material;

a cropped cylindrical via partially filled with a conducting material thereby creating a via with a cropped toroidal shape;

a castellation.

26. The planar circuit module of claim 17 wherein one or more of said edge vias comprise a via selected from the list of:

a printed line along said edge face of said planar circuit module;

a deposited line established along said edge face of said planar circuit; and, a wire positioned along said edge face of said planar circuit module.

27. The planar circuit module of claim 17 further comprising one or more air lines.

28. The planar circuit module of claim 27 wherein said air line comprises one or more cavities in said edge launch electrical connector assembly between a conductor in contact with one or more of said signal lines and one or more of said grounds associated with said edge launch electrical connector assembly.

29. The planar circuit module of claim 27 wherein one or more of said air lines are filled with one or more gases selected from the list of:

air;

nitrogen; and, non-corrosive gas.

30. The planar circuit module of claim 17 wherein two or more of said edge vias are disposed symmetrically around one of said signal lines.

31. The planar circuit module of claim 17 wherein two of said edge vias are disposed very close to one of said signal lines.

32. An edge launch electrical connector assembly for establishing improved electrical connections with a planar circuit module comprising two or more edge vias and one or more signal conductors wherein said edge launch electrical connector assembly comprises:

one or more connectors or launchers capable of establishing an electrical connection to a cable wherein said electrical connection comprises at least one ground connection and at least one signal connection;

one or more ground conductors for providing an electrical connection between said edge vias and said buried or exposed ground connection;

one or more signal conductors for providing an electrical connection between said signal line and said signal connection;

wherein the edge vias provide the shortest possible path to the buried or exposed ground plane.

33. The edge launch electrical connector assembly of claim 32 wherein said planar circuit module is selected from this list of:

a planar circuit board comprising one or more metal layers;

a package for integrated circuits comprising one or more metal layers;

a circuit and one or more metal layers established on a substrate; and a circuit established on a substrate coupled with one or more metal layers.

34. The edge launch electrical connector assembly of claim 32 wherein said edge launch electrical connector assembly further comprises one or more brackets.

35. The edge launch electrical connector assembly of claim 34 wherein said bracket provides said one or more of said ground conductors.

36. The edge launch electrical connector assembly of claim 32 wherein said signal conductor comprises a central pin embedded in a bead.

37. The edge launch electrical connector assembly of claim 32 wherein said electrical connector is a coaxial connector or launcher.

38. The edge launch electrical connector assembly of claim 32 wherein one or more of said edge vias comprise a via selected from the list of:

a cropped cylindrical via filled with a conducting material;

a cropped cylindrical via partially filled with a conducting material thereby creating a via with a cropped toroidal shape;

a castellation.

39. The edge launch electrical connector assembly of claim 32 wherein one or more of said edge vias comprise a via selected from the list of:

a printed line along said edge face of said planar circuit module;

a deposited line established along said edge face of said planar circuit; and, a wire positioned along said edge face of said planar circuit module.

40. The edge launch electrical connector assembly of claim 32 further comprising one or more air lines.

41. The edge launch electrical connector assembly of claim 40 wherein said air line comprises one or more cavities in said edge launch electrical connector assembly between one or more of said signal conductors and one or more of said ground conductors.

42. The edge launch electrical connector assembly of claim 40 wherein one or more of said air lines are filled with one or more gases selected from the list of:

air;

nitrogen; and, non-corrosive gas.

43. A system with improved electrical connections between a planar circuit module and an edge launch electrical connector assembly comprising:

a planar circuit module comprising:

one or more buried or exposed ground planes;

one or more signal lines disposed in the plane of said planar circuit module and extending substantially to the edge of said planar circuit module for launching a signal out of said planar circuit module;

two or more edge vias disposed along an edge face of said planar circuit module for establishing an electrical connection to one or more buried or exposed ground planes of said planar circuit module; and an edge launch electrical connector assembly comprising:

one or more connectors or launchers capable of establishing an electrical connection to a cable wherein said electrical connection comprises a ground connection and a signal connection;

one or more ground conductors for providing an electrical connection between said edge vias and said buried or exposed ground connection; and one or more signal conductors for providing an electrical connection between said signal line and said signal connection;

wherein said planar circuit module is coupled to said edge launch connector assembly thereby establishing an improved ground return path.

44. The system of claim 43 wherein said planar circuit module is selected from this list of:

a planar circuit board comprising one or more metal layers;

a package for integrated circuits comprising one or more metal layers;

a circuit and one or more metal layers established on a substrate; and a circuit established on a substrate coupled with one or more metal layers.

45. The system of claim 43 wherein said edge launch electrical connector assembly comprises one or more electrical connectors or launchers.

46. The system of claim 43 wherein said edge launch electrical connector assembly further comprises one or more brackets.

47. The system of claim 46 wherein said bracket provides said ground conductor.

48. The system of claim 43 wherein said signal conductor comprises a central pin embedded in a bead.

49. The system of claim 43 wherein said electrical connector is a coaxial connector or launcher.

50. The system of claim 43 wherein one or more of said edge vias comprise a via selected from the list of:

a cropped cylindrical via filled with a conducting material;

a cropped cylindrical via partially filled with a conducting material thereby creating a via with a cropped toroidal shape;

a castellation.

51. The system of claim 43 wherein one or more of said edge vias comprise a via selected from the list of:

a printed line along said edge face of said planar circuit module;

a deposited line established along said edge face of said planar circuit; and, a wire positioned along said edge face of said planar circuit module.

52. The system of claim 43 further comprising one or more air lines.

53. The system of claim 52 wherein said air line comprises one or more cavities in said edge launch electrical connector assembly between one or more signal conductors and one or more ground conductors.

54. The system of claim 52 wherein one or more of said air lines are filled with one or more gases selected from the list of:

air;

nitrogen; and, non-corrosive gas.

55. The system of claim 43 wherein two or more of said edge vias are disposed symmetrically around one of said signal lines.

56. The system of claim 43 wherein two of said edge vias are disposed very close to one of said signal lines.

57. The system of claim 43 coupled to one or more cables.

58. The system of claim 43 wherein one or more of said cables comprises a coaxial cable.

* * * * *